(12) United States Patent
Church

(10) Patent No.: US 8,796,739 B2
(45) Date of Patent: *Aug. 5, 2014

(54) BALLASTED POLYCRYSTALLINE FUSE

(71) Applicant: Intersil Corporation, Palm Bay, FL (US)

(72) Inventor: Michael D. Church, Canyon Lake, FL (US)

(73) Assignee: Intersil Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,537

(22) Filed: Dec. 31, 2013

(65) Prior Publication Data
US 2014/0110819 A1  Apr. 24, 2014

Related U.S. Application Data

(60) Continuation of application No. 13/356,263, filed on Jan. 23, 2012, now Pat. No. 8,728,875, which is a division of application No. 11/963,236, filed on Dec. 21, 2007, now Pat. No. 8,101,977.

(60) Provisional application No. 60/916,905, filed on May 9, 2007.

(51) Int. Cl.
*H01L 27/10* (2006.01)
*H01L 23/525* (2006.01)

(52) U.S. Cl.
CPC ................ *H01L 23/5256* (2013.01)
USPC ............. 257/209; 257/50; 257/529; 257/530

(58) Field of Classification Search
CPC .......... H01L 23/5256; H01L 23/5258
USPC ................... 257/50, 209, 529, 530
See application file for complete search history.

(56) References Cited

U.S. PATENT DOCUMENTS 5,969,404 A  10/1999  Bohr et al.
5,976,943 A  11/1999  Manley et al.

OTHER PUBLICATIONS

U.S. Patent and Trademark Office, "Advisory Action", from U.S. Appl. No. 11/963,236, May 1, 2009, pp. 1-3, Published in: US.
U.S. Patent and Trademark Office, "Advisory Action", from U.S. Appl. No. 11/963,236, May 26, 2010, pp. 1-3, Published in: US.
U.S. Patent and Trademark Office, "Final Office Action", from U.S. Appl. No. 11/963,236, Apr. 16, 2009, pp. 1-9, Published in: US.
U.S. Patent and Trademark Office, "Final Office Action", from U.S. Appl. No. 11/963,236, Apr. 16, 2010, pp. 1-9, Published in: US.
U.S. Patent and Trademark Office, "Notice of Allowance", from U.S. Appl. No. 11/963,236, Oct. 26, 2011, pp. 1-5, Published in: US.
U.S. Patent and Trademark Office, "Office Action", from U.S. Appl. No. 11/963,236, May 22, 2008, pp. 1-5, Published in: US.

(Continued)

*Primary Examiner* — Samuel Gebremariam
(74) *Attorney, Agent, or Firm* — Fogg & Powers LLC

(57) ABSTRACT

A polycrystalline fuse includes a first layer of polycrystalline material on a substrate and a second layer of a silicide material on the first layer. The first and second layers are shaped to form first and second terminal portions of a first width joined along a length of the fuse by a fuse portion of a second width narrower than the first width. First and second contacts are connected to the first and second terminal portions respectively. The silicide material being discontinuous in a terminal region of the second layer along the length of the fuse.

14 Claims, 4 Drawing Sheets

(56) References Cited

OTHER PUBLICATIONS

U.S. Patent and Trademark Office, "Office Action", from U.S. Appl. No. 11/963,236, Jun. 25, 2009, pp. 1-7, Published in: US.

U.S. Patent and Trademark Office, "Office Action", from U.S. Appl. No. 11/963,236, Dec. 2, 2009, pp. 1-9, Published in: US.

U.S. Patent and Trademark Office, "Restriction Requirement", from U.S. Appl. No. 11/963,236, Aug. 25, 2008, pp. 1-4, Published in: US.

U.S. Patent and Trademark Office, "Restriction Requirement", from U.S. Appl. No. 11/963,236, Dec. 11, 2008, pp. 1-5, Published in: US.

U.S. Patent and Trademark Office, "Notice of Allowance", from U.S. Appl. No. 13/356,263, Dec. 9, 2013, pp. 1-11, Published in: US.

U.S. Patent and Trademark Office, "Ex Parte Quayle Office Action", from U.S. Appl. No. 13/356,263, Oct. 9, 2013, pp. 1-7, Published in: US.

"On-Chip Electrically Programmable Fuse", "IBM Technical Disclosure Bulletin", Aug. 1, 1986, pp. 1291-1292, vol. 29, No. 3, Publisher: IBM Corporation, Published in: US.

U.S. Patent and Trademark Office, "Notice of Allowance", from U.S. Appl. No. 13/356,263, Feb. 24, 2014, pp. 1-8, Published in: US.

BALLASTED POLYCRYSTALLINE FUSE

CROSS-REFERENCE TO RELATED APPLICATIONS

This application is a continuation of U.S. application Ser. No. 13/356,263, filed on Jan. 23, 2013, which is a continuation of U.S. application Ser. No. 11/963,236, filed on Dec. 21, 2007 and claims the benefit of priority to U.S. Provisional Application No. 60/916,905, filed on May 9, 2007, the disclosures of which are hereby incorporated herein by reference.

BACKGROUND AND SUMMARY OF THE DISCLOSURE

The present disclosure relates generally to polycrystalline fuses and, more specifically to silicided polycrystalline fuses.

Fuses in an integrated circuit are used for trimming circuits as well as programming memory. One type of fuse is a polycrystalline or polysilicon fuse which is a polycrystalline material with a layer of silicide on the top. The silicon layer provides the major current path in an unprogrammed fuse since it has a lower resistance than the polycrystalline material. The fuse is programmed by applying a programming current to form an open circuit in the silicide layer. This creates a current path from the silicide through the polysilicon layer and back out the silicide. The increase of resistance is then sensed once the open circuit is created in the silicide. A typical prior art fuse is illustrated in FIGS. 1A and 1B.

The designer must balance a requirement to increase the difference in resistance between the programmed and unprogrammed fuse with the die area required for the drive transistor for programming the increased resistance programmed fuse. Since the mechanism takes place by migration of the silicide in the neck region of the fuse, it is desirable to create a larger temperature gradient. One method is to increase the size of the cathode as described in "Electrically Programmable Fuse (eFUSE) Using Electromigration And Silicides," by C. Kothandaraman, IEEE Electron Device Letters, Vol. 23, No. 9, September 2002.

A polycrystalline fuse of the present disclosure includes a first layer of polycrystalline material on a substrate and a second layer of a silicide material on the first layer. The first and second layers are shaped to form first and second terminal portions of a first width joined along a length of the fuse by a fuse portion of a second width narrower than the first width. First and second contacts are connected to the first and second terminal portions respectively. The silicide material being discontinuous in a terminal region of the second layer along the length of the fuse. This structure increases the unprogrammed resistance and creates a large temperature gradient during programming.

As implemented, the second layer includes a third material of a higher resistance than the silicide material in one of the terminal portions and in series with the silicide material between the first and second contacts to form the discontinuity. The discontinuity or third material may be in both of the terminal portions of the second layer. The third material may be a dielectric material.

The polycrystalline material may be silicon and the silicide material may be one of cobalt silicide, titanium silicide, tantalum silicide and platinum silicide. The first and second contacts may be connected to the first and second terminal portions of the second layer.

An integrated circuit may include the present fuse and a transistor connected to one of the contacts for driving the fuse with sufficient current to program the fuse.

A method of forming the present fuse includes applying a first layer of polycrystalline material on a substrate to form first and second terminal portions of a first width joined by a fuse portion of a second width narrower than the first width. A mask is formed on the first layer with openings exposing regions of the fuses portion and most, but not all of the terminal portions of the first layer along a length of the terminal portions. A second layer of a silicide material is applied on the exposed regions of the first layer; and first and second contacts are formed to the first and second terminal regions respectively.

The contacts may be made to the second layer. The method includes covering the second layer and mask with an insulative layer and forming openings in the insulative layer to expose the terminal regions and forming the contacts in the openings of the insulative layer.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1A:
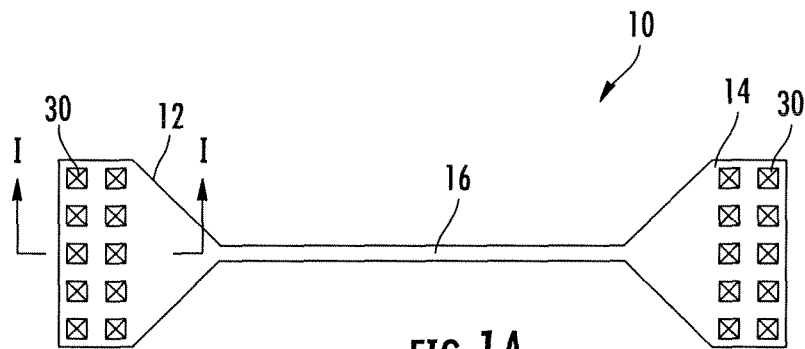
FIG. 1A is a plan view of a polycrystalline fuse of the prior art.
Figure 1B:
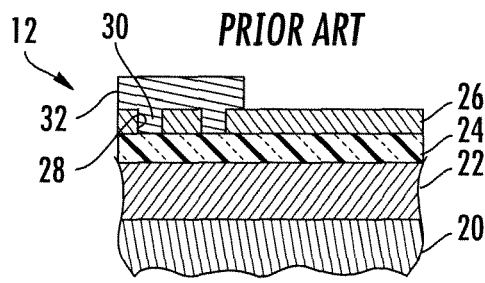
FIG. 1B is cross-sectional view of the polycrystalline fuse of FIG. 1A along line I-I.

A polycrystalline fuse 10 of the prior art is illustrated in FIGS. 1A and 1B. The fuse includes terminal portions or regions 12 and 14 interconnected by a fuse portion or region 16 which is narrower than the terminal portions 12 and 14. The fuse includes a polycrystalline, for example a polysilicon, layer 22 on a substrate 20. A silicide layer 24 lies over and is patterned as is the polycrystalline layer 22. An insulative layer 26 includes openings or vias 28 through which contacts 30 are made to the surface of the silicide layer 24 and are part of interconnect 32. Programming current applied to the interconnect 32 causes migration of the silicide and a programming or open circuit of the silicide layer 24 in the neck down or fuse portion 16.

Figure 2A:
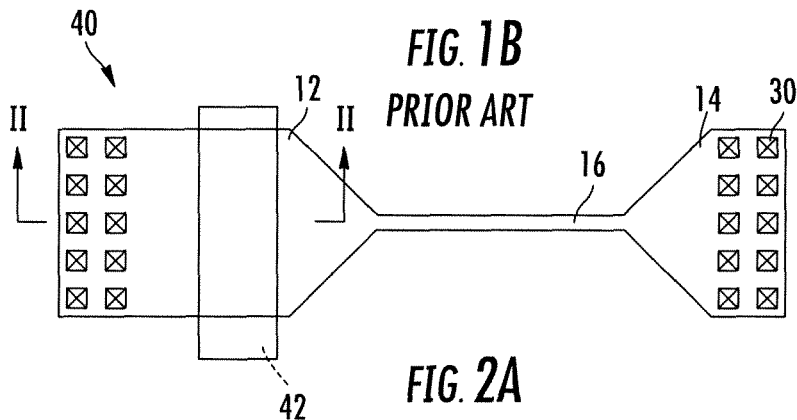
FIG. 2A is a plan view of a polycrystalline fuse incorporating the principles of the present disclosure.
Figure 2B:
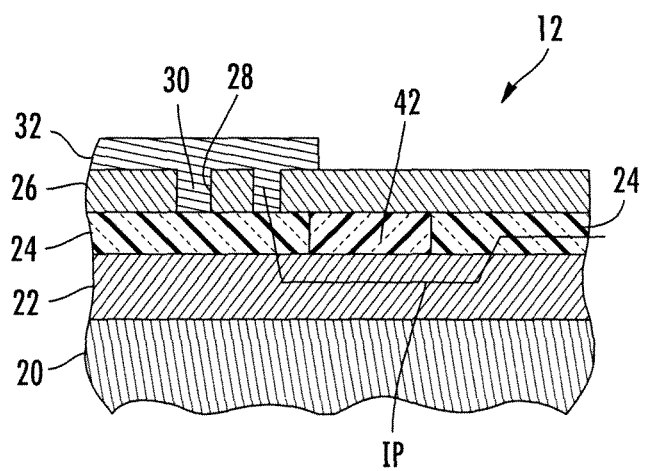
FIG. 2B is cross-sectional view of the polycrystalline fuse of FIG. 2A along line II-II.

In contrast, a polycrystalline fuse of the present design is illustrated in FIGS. 2A and 2B. Those elements which have the same function or structure include the same numbers as FIGS. 1A and 1B. The major difference between the fuse of FIGS. 1A and 1B of the prior art and the present fuse of FIGS. 2A and 2B is that the silicide layer 24 is made discontinuous in the terminal region 12 such that the current path from the interconnect 32 and via 30 to the silicide layer 24 must flow through a portion of the polycrystalline layer 22 before it flows through the remaining silicide layer 24 on the terminal 12. The current path is illustrated by the line IP.

This continuity is created by providing a material 42 of a higher resistance than the silicide 24. This may be any type of material. In the example used and illustrated in the method of FIGS. 8 and 9, this material is an insulated material and may be part of masking material which defines the pattern of the silicide layer 24. Since the polycrystalline layer 22 has a higher resistance than the silicide layer 24, even if the polycrystalline layer 22 is doped with impurities, the unprogrammed resistance of the fuse is increased. This increased resistance also creates a higher temperature at the terminal 12 which increases the temperature gradient.

To illustrate the operation of the present fuse compared to the prior art fuse, four fuses were constructed and programmed. The four fuses are listed in Table 1.

TABLE 1

| Fuse | Poly | Neck | Silicide |
|---|---|---|---|
| A | P+ | 6 μm × 0.24 μm | Continuous |
| B | In | 6 μm × 0.24 μm | Continuous |
| C | P+ | 3 μm × 0.24 μm | Discontinuous Cathode |
| D | P+ | 3 μm × 0.24 μm | Discontinuous Anode |

The first two fuses, A and B, had a longer neck than the second two fuses, C and D, in that the terminal portion of fuses C and D were larger and therefore the length of the neck portion was shorter for the same foot print. While fuses A, C, D had a doped polycrystalline layer, fuse B had an intrinsic or undoped polycrystalline layer. Fuses A and B of the prior art had a continuous silicide layer wherein fuses C and D of the present disclosure has a discontinuous silicide layer. C was discontinuous at the cathode terminal and D at the anode terminal.

The four fuses were tested by applying five volts using a forty micron NMOS driver transistor. The results are illustrated in FIGS. 3-6, for fuses A, B, C and D, respectfully. While the unprogrammed resistance of fuses A and B are generally in the range of 100 ohm, the unprogrammed resistance of fuses C and D according to the present disclosure is generally in the range of 200 ohm. The increased resistance minimizes the current needed to read or sense the intact or unprogrammed fuse which leads to the smaller area required for the sensing circuit.

Figure 3:
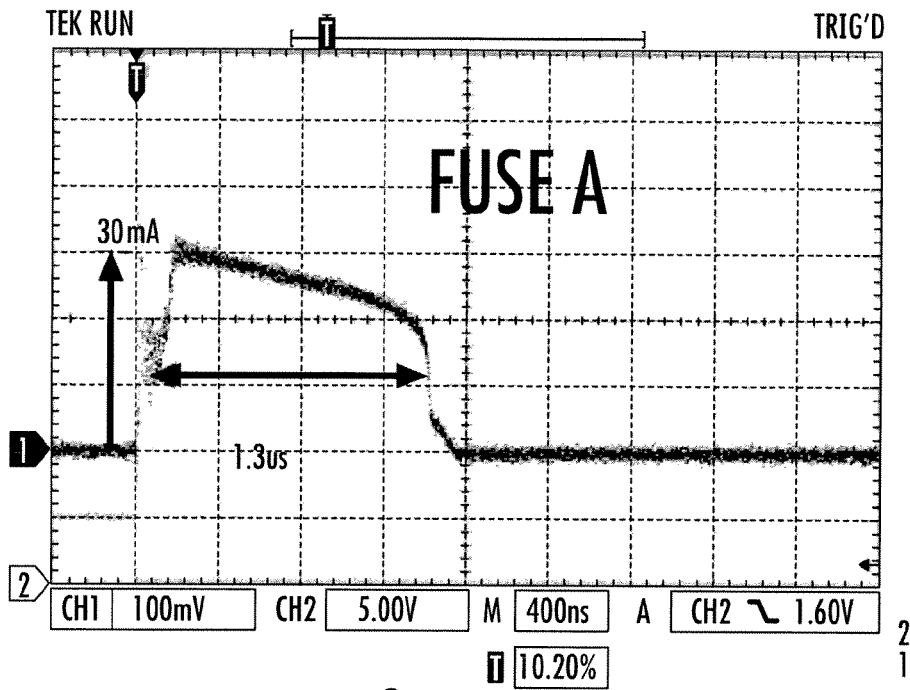
FIG. 3 is a graph of voltage verse time during programming of fuse A of the prior art.
Figure 4:
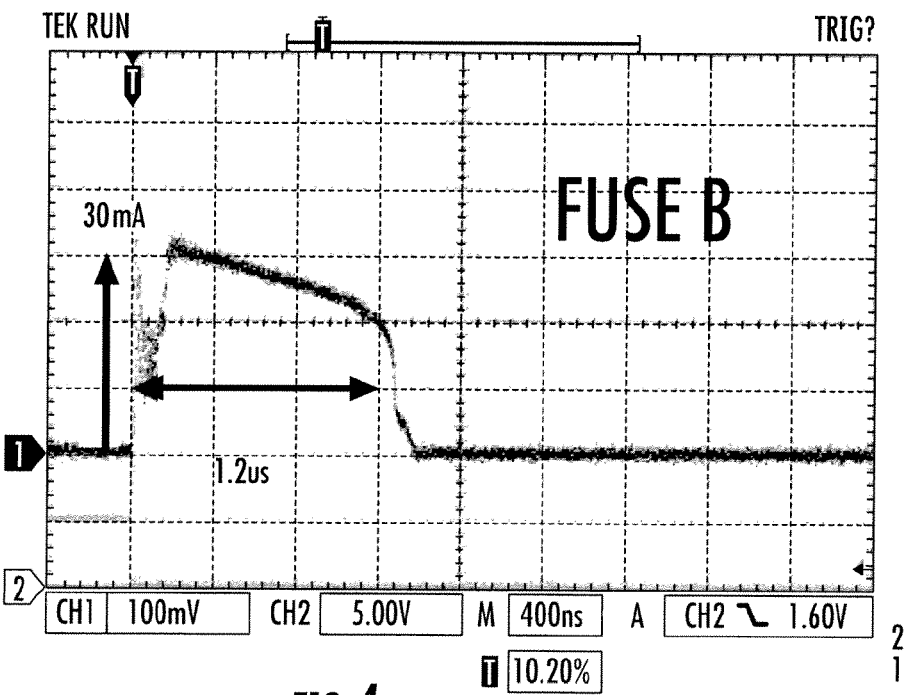
FIG. 4 is a graph of voltage verse time during programming of fuse B of the prior art.
Figure 5:
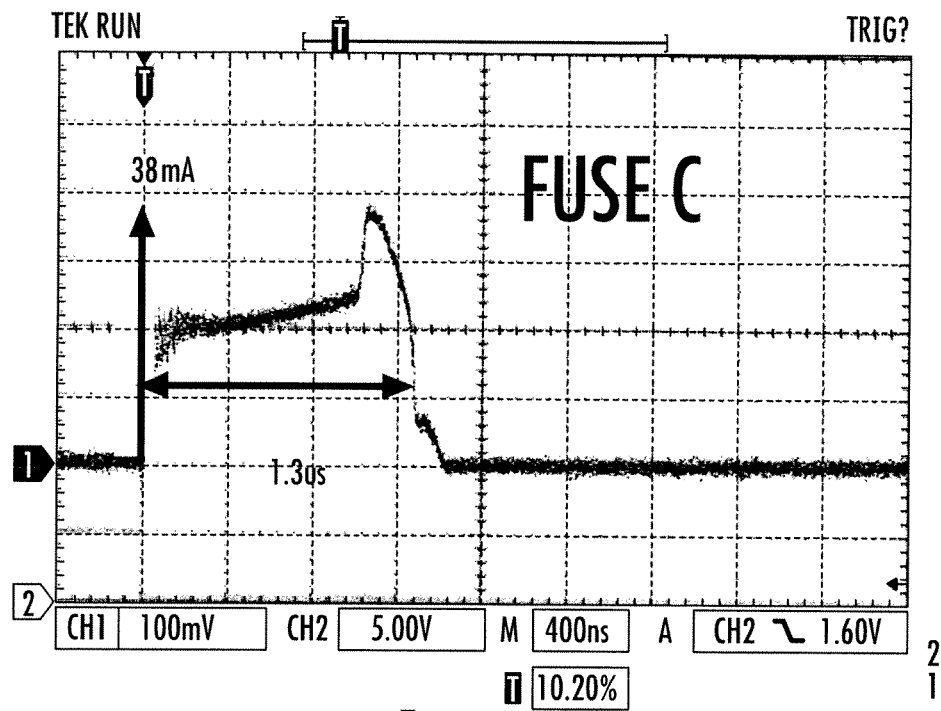
FIG. 5 is a graph of voltage verse time during programming of fuse C of the present disclosure.
Figure 6:
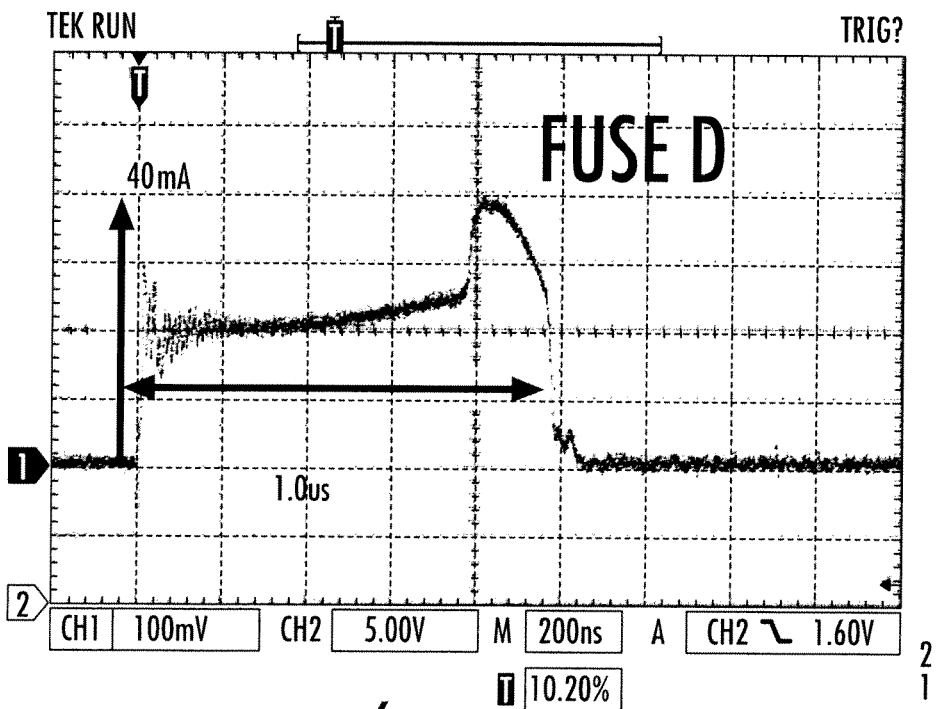
FIG. 6 is a graph of voltage verse time during programming of fuse D of the present disclosure.

A review of FIGS. 3 and 4 for fuses A and B of the prior art illustrates that the programming current quickly rises to approximately 30 milliamps and slowly diminishes over approximately 1 microsecond until the migration is over and the silicide ruptures such that no further current is carried.

Fuses C and D of the present structure operate in a different mechanism. The current initially rises to about half of its current carrying capacity which extends over approximately 1 microsecond. At the end a current spike is created such that the current goes up to approximately 40 milliamps leading to the rupture or programming of the silicide layer. The discontinuity of the silicide requiring the program current to flow through the polycrystalline layer causes a temperature rise of the polycrystalline layer the rise in temperature in this region of the polycrystalline layer increase the carrier concentration. This reduces the resistance of the fusing path until it reaches the point to create the spike which blows the silicide at the neck down fuse portion.

Thus the increased resistance which allows the greater differentiation between a programmed and unprogrammed fuse does not increase the amount of time it takes to program a fuse or the drive voltage necessary.

Experiments have shown that a 100 micron width NMOS driver is capable of programming fuse D at 5.5 volts. Thus, the size of the driver can be substantially reduced to provide reliable programming of the polycrystalline duse.

Figure 7:
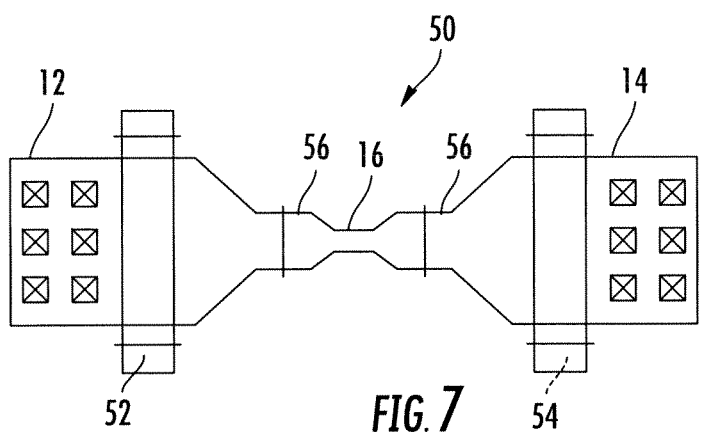
FIG. 7 is a plan view of another embodiment of a polycrystalline fuse incorporating the principles of the present disclosure.

A further example of a fuse according to the present disclosure is illustrated in FIG. 7 wherein the terminal portions 12 and 14 each include a discontinuous section 52 and 54 in the silicide layer 24. This discontinuity is with a material having a higher resistance than that of the silicide layer 24. It should also be noted that the taper section 56 between the terminals portions 12 and 14 and the fuse portion 16 is a multiple step-down structure. Also the fuse portion 16 is substantially shorter than that in FIG. 2A.

Figure 8:
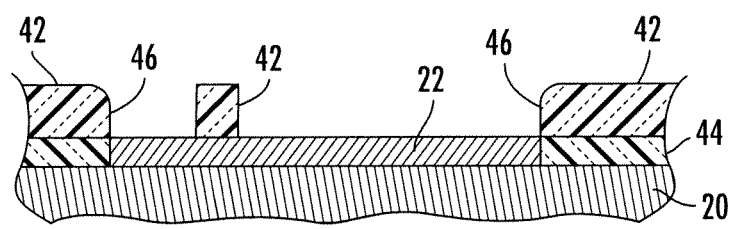
FIGS. 8 and 9 are cross-sectional view illustrating the process of making a polycrystalline fuse incorporating the principles of the present disclosure.
Figure 9:
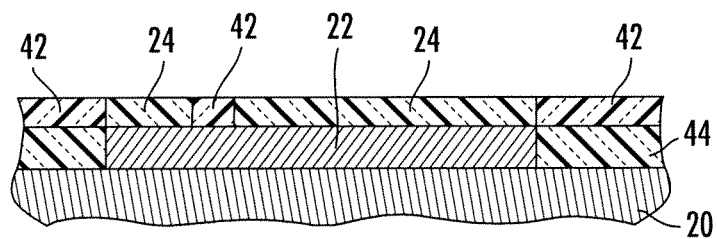

The method of making the polycrystalline fuse of the present disclosure is illustrated in FIGS. 8 and 9. The first layer of polycrystalline 22 is applied to a substrate 20 and patterned to form the first and second terminal portions 12 and 14 of a first width joined by a fuse portion 16 of a second width narrower than the first width. The pattern polycrystalline layer 22 is surrounded by an insulative layer 44. A second insulative layer 42 is applied to the polycrystalline layer 22 and the first insulative layer 44 and patterned to provide a mask for the silicide layer. Openings 46 in the insulative layer 42 expose those portions of the polycrystalline layer 22 which will receive the silicide layer. The structure of FIG. 8 is then subject to application of a silicide material and heating to form the silicide layer 24 in the opening 46 is illustrated in FIG. 9. The process is completed by providing additional pacification or insulative layers, forming the vias and metallization to form openings 28 in the pacification layer 26 and metallization with vias 30 extending from interconnect 32.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed:

1. A polycrystalline fuse comprising:
    a first layer of polycrystalline material on a substrate;
    a second layer of a silicide material on the first layer;
    the first and second layers being shaped to form first and second terminal portions joined along a length of the fuse by a fuse portion having a width narrower than the first and second terminal portions;
    first and second contacts connected to the first and second terminal portions respectively of the second layer forming the fuse material in the fuse portion; and
    the silicide material being discontinuous in one of the terminal portions of the second layer along the length of the fuse prior to programming.

2. The polycrystalline fuse of claim 1, wherein the polycrystalline material is silicon.

3. The polycrystalline fuse of claim 1, wherein the silicide material is one of cobalt silicide, titanium silicide, tantalum silicide and platinum silicide.

4. The polycrystalline fuse of claim 1, wherein the discontinuity is in both of the terminal portions of the second layer.

5. The polycrystalline fuse of claim 1, wherein the first and second contacts are connected to the first and second terminal portions of the second layer.

6. An integrated circuit comprising a fuse of claim 1 and a transistor connected to one of the contacts for driving the fuse with sufficient current to program the fuse.

7. A polycrystalline fuse comprising:
a first layer of polycrystalline material on a substrate;
a second layer of a silicide material on the first layer;
the first and second layers being shaped to form first and second terminal portions joined along a length of the fuse by a fuse portion having a width narrower than the first and second terminal portions;
first and second contacts connected to the first and second terminal portions respectively of the second layer forming the fuse material in the fuse portion; and
the second layer including a third material of a higher resistance than the silicide material in one of the terminal portions and in series with the silicide material between the first and second contacts prior to programming.

8. The polycrystalline fuse of claim 7, wherein the third material is a dielectric material.

9. The polycrystalline fuse of claim 7, wherein the polycrystalline material is silicon.

10. The polycrystalline fuse of claim 7, wherein the silicide material is one of cobalt silicide, titanium silicide, tantalum silicide and platinum silicide.

11. The polycrystalline fuse of claim 7, wherein the third material is in both of the terminal portions of the second layer.

12. The polycrystalline fuse of claim 7, wherein the first and second contacts are connected to the first and second terminal portions of the second layer.

13. An integrated circuit comprising a fuse of claim 1 and a transistor connected to one of the contacts for driving the fuse with sufficient current to program the fuse.

14. A polycrystalline fuse comprising:
a first layer of polycrystalline material on a substrate;
a fuse layer on the first layer;
the first and second layers being shaped to form first and second terminal portions joined along a length of the fuse by a fuse portion having a width narrower than the first and second terminal portions;
first and second contacts connected to the first and second terminal portions respectively; and
the fuse layer being constructed prior to programming to have an initial current carrying capacity of half of a maximum current carrying capacity for a substantial portion of a programming period and have the maximum current carrying capacity near the end of the programming period.

* * * * *